US012757541B2

(12) United States Patent
Son et al.

(10) Patent No.: US 12,757,541 B2
(45) Date of Patent: Oct. 6, 2026

(54) LIGHT EMITTING APPARATUS HAVING SIDEWALL WITH A GROOVE

(71) Applicant: Seoul Semiconductor Co., Ltd., Gyeonggi-do (KR)

(72) Inventors: Jung Hun Son, Gyeonggi-do (KR); Hye In Kim, Gyeonggi-do (KR)

(73) Assignee: Seoul Semiconductor Co., Ltd., Gyeonggi-do (KR)

( * ) Notice: Subject to any disclaimer, the term of this patent is extended or adjusted under 35 U.S.C. 154(b) by 617 days.

(21) Appl. No.: 18/200,329

(22) Filed: May 22, 2023

(65) Prior Publication Data

US 2024/0079537 A1 Mar. 7, 2024

Related U.S. Application Data

(63) Continuation of application No. PCT/KR2021/016798, filed on Nov. 16, 2021.

(60) Provisional application No. 63/116,558, filed on Nov. 20, 2020.

(51) Int. Cl.
*H10H 20/855* (2025.01)
*H10W 90/00* (2026.01)

(52) U.S. Cl.
CPC .......... *H10H 20/855* (2025.01); *H10W 90/00* (2026.01)

(58) Field of Classification Search
CPC ......................... H10H 20/857; H10H 20/8512
USPC ................................................ 257/79, 88–89
See application file for complete search history.

(56) References Cited

U.S. PATENT DOCUMENTS

2014/0362570 A1 12/2014 Miyoshi et al.
2016/0372528 A1 12/2016 Kamura et al.
2018/0226385 A1* 8/2018 Nakabayashi ..... H10H 20/8514
2018/0226549 A1* 8/2018 Nakabayashi ....... H10H 20/857
2020/0035769 A1 1/2020 Youn et al.
(Continued)

FOREIGN PATENT DOCUMENTS

JP 01040515 A 2/1982
JP 2004-172443 A 6/2004
JP 2020013948 A * 1/2020
(Continued)

OTHER PUBLICATIONS

Extended European Search Report for European Applicatoin No. 21895070.7, Sep. 18, 2024, 8 pages.
(Continued)

*Primary Examiner* — Ratisha Mehta
*Assistant Examiner* — Mikka Liu
(74) *Attorney, Agent, or Firm* — LaBatt, LLC

(57) ABSTRACT

A light-emitting device according to one embodiment of the present invention comprises: a substrate; a plurality of light-emitting diode chips positioned on the substrate; a plurality of light-transmitting layers positioned on the top surfaces of the plurality of light-emitting diode chips; a sidewall portion surrounding the plurality of light-emitting diode chips and the plurality of light-transmitting layers; and a first groove positioned on the top surface of at least a portion of the sidewall portion positioned between the light-transmitting layers, wherein the first groove has a width smaller than a shortest width from an adjacent light-transmitting layer to the first groove and has a depth smaller than the thickness of the closest light-transmitting layer.

20 Claims, 12 Drawing Sheets

(56) References Cited

U.S. PATENT DOCUMENTS

| | | | |
|---|---|---|---|
| 2020/0220057 | A1 | 7/2020 | Kim et al. |
| 2020/0328328 | A1 | 10/2020 | Nakai et al. |

FOREIGN PATENT DOCUMENTS

| | | | | | |
|---|---|---|---|---|---|
| JP | 6733646 | B2 | | 8/2020 | |
| KR | 10-2019-0085479 | A | | 7/2019 | |
| KR | 10-2020-0012604 | A | | 2/2020 | |
| WO | WO-2019139357 | A1 | * | 7/2019 | ........... H10H 20/857 |

OTHER PUBLICATIONS

International Search Report for International Application No. PCT/KR2021/016798, Feb. 28, 2022, 3 pages.

Office action for corresponding Korean Patent Application No. 1020237020648, Nov. 11, 2025, 5 pages (no English translation available).

* cited by examiner

LIGHT EMITTING APPARATUS HAVING SIDEWALL WITH A GROOVE

CROSS-REFERENCE TO RELATED APPLICATIONS

This application is a continuation of International Patent Application No. PCT/KR2021/016798, filed on Nov. 16, 2021, which claims the benefit of U.S. Provisional Patent Application No. 63/116,558, filed on Nov. 20, 2020, each of which is hereby incorporated by reference for all purposes as if fully set forth herein.

TECHNICAL FIELD

The present disclosure relates to a light emitting apparatus.

BACKGROUND ART

A light emitting chip is a semiconductor device that emits light generated by recombination of electrons and holes, and has been recently used in various technical fields such as displays, vehicle lamps, general lighting, and others. Light emitting chips have a long lifespan, low power consumption, and fast response speed, and thus, they have been applied to various technical fields such as vehicle lamps, display apparatuses, and others.

In a case of a light emitting apparatus applied to the vehicle lamp or a backlight of the display, it may be required to control a light spreading phenomenon toward a side surface of the light emitting apparatus. For example, in a case that the light spreading occurs on the side surface of the light emitting apparatus, a cutoff line, which is a boundary between a bright portion and a dark portion, is not clearly distinguished when light emitted from the vehicle lamp is irradiated to a front of the car. As a result, light may be irradiated to an unnecessary region, and thus, a view of another driver may be obstructed. In addition, in a case of the display, it is difficult to obtain a uniform backlight when the light spreading phenomenon occurs on the side surface of the light emitting apparatus. In a case of a particular product among general lighting products, a light emitting apparatus configured to prevent the light spreading toward a side surface thereof is required.

DISCLOSURE

Technical Problem

Embodiments of the present disclosure provide a light emitting apparatus configured to prevent a light spreading phenomenon of the light emitting apparatus.

Embodiments of the present disclosure provide a light emitting apparatus configured to prevent a light spreading in a local region between light emitting diode chips in the light emitting apparatus including at least two or more light emitting diode chips.

Technical Solution

A light emitting apparatus according to an embodiment of the present disclosure includes a substrate; a plurality of light emitting diode chips disposed over the substrate; a plurality of light transmission layers disposed on upper surfaces of the plurality of light emitting diode chips; a sidewall portion surrounding the plurality of light emitting diode chips and the plurality of light transmission layers; and a first groove and a second groove disposed on an upper surface of at least a portion of the sidewall portion, in which the first groove has a width narrower than a shortest width from at least one nearest light transmission layer to the first groove, and may have a depth smaller than a thickness from an upper surface to a lower surface of the at least one nearest light transmission layer.

The substrate may have pattern electrodes on an upper surface and a lower surface, and may have a circuit pattern including vias electrically connecting the pattern electrodes on the upper surface and the lower surface.

The plurality of light transmission layers may include a wavelength conversion material.

Widths of upper and lower surfaces of the plurality of light transmission layers may be same.

The widths of lower surfaces of the plurality of light transmission layers may be formed wider than those of the plurality of light emitting diode chips.

The widths of upper surfaces of the plurality of light transmission layers may be wider than those of the lower surfaces.

The sidewall portion may include an outer wall portion surrounding outer surfaces of the plurality of light emitting diode chips and the plurality of light transmission layers and an inner wall portion formed between side surfaces of the plurality of light emitting diode chips and the plurality of light transmission layers facing each other.

The outer wall portion may have an inclined surface in which a thickness from the substrate decreases as a distance from a surface adjacent to a side surface of the light transmission layer increases.

The first groove and the second groove may be formed in a linear line elongated along the side surfaces of the plurality of light transmission layers.

A shortest distance from the substrate to the first groove may be farther than a shortest distance from the substrate to the second groove.

The substrate may include a first side surface and a second side surface opposite to the first side surface, and may have a first groove extension extending to the first side surface and a second groove extension extending to the second side surface.

A length of the first groove extension may be longer than that of the second groove extension.

The sidewall portion may include an outer wall portion and an inner wall portion, and the first groove extension and the second groove extension may be disposed on the outer wall portion.

A distance between the first side surface and an end portion of the first groove extension may be shorter than a distance between the second side surface and an end portion of the second groove extension.

A third groove and a fourth groove perpendicular to the first groove and the second groove, and disposed on the side surfaces of the plurality of light transmission layers may be further included.

Respective distances from the side surfaces of the plurality of light transmission layers to the first, second, third, and fourth grooves may be similar.

The first groove and the second groove may have an extension portion passing through the fourth groove and disposed on the outer wall portion, and the third groove and the fourth groove may have an extension portion passing through the second groove and disposed on the outer wall portion.

The first groove and the third groove may vertically intersect in a region where at least four edges of the plurality of light transmission layers are adjacent.

Advantageous Effects

A light emitting apparatus according to an embodiment of the present disclosure may prevent light from transmitting a sidewall portion using a groove, thereby preventing a light spreading to adjacent light emitting diode chips.

A light emitting apparatus according to another embodiment of the present disclosure may prevent a light spreading occurring on a side surface of the light emitting apparatus by adjusting a width of an outer wall portion.

BEST MODE

Figure 1A:
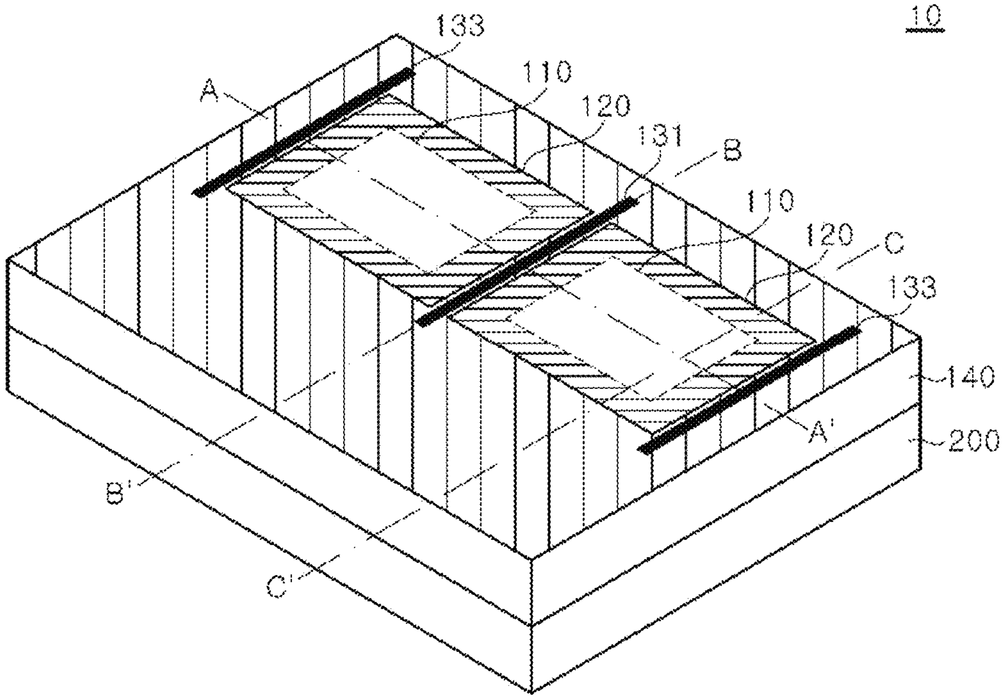
FIG. 1*a* is a schematic perspective view illustrating a light emitting apparatus according to an embodiment of the present disclosure.
Figure 1B:
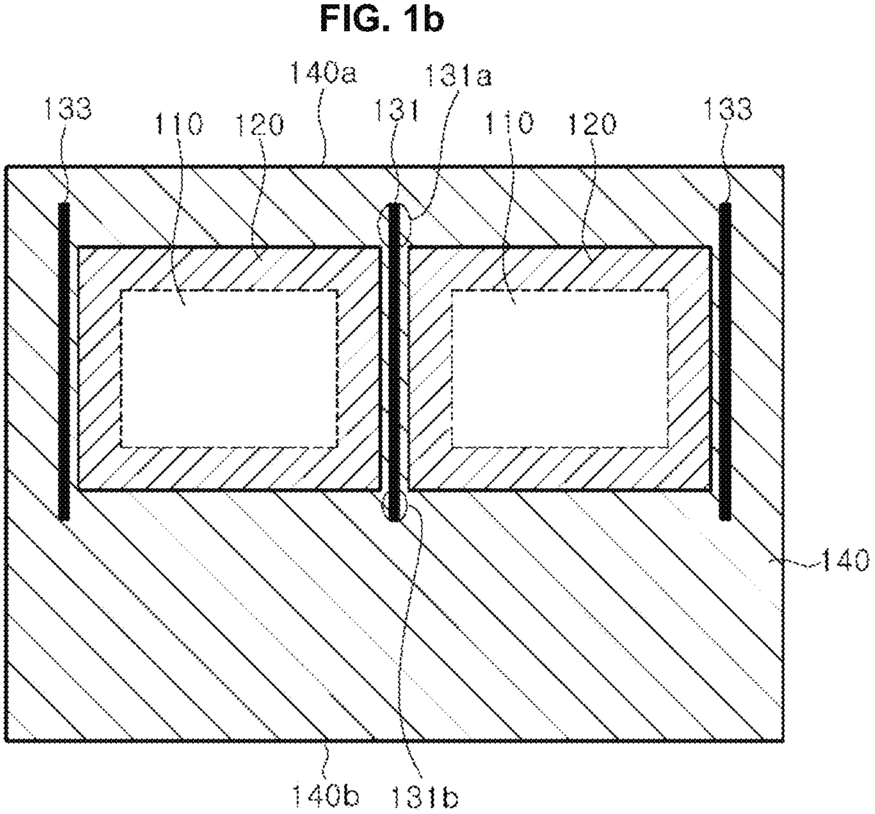
FIG. 1*b* is a schematic plan view taken along line A-A' of FIG. 1*a*.
Figure 1C:
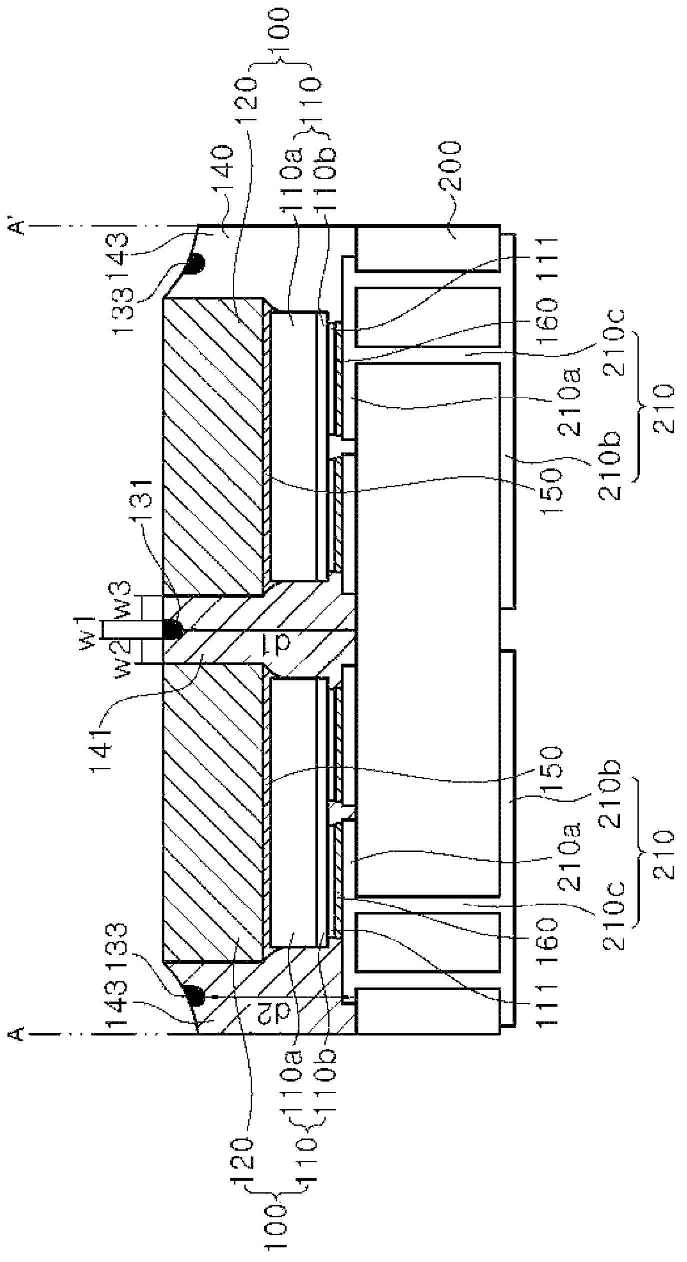
FIG. 1*c* is a schematic cross-sectional view taken along line A-A' of FIG. 1*a*.
Figure 1D:
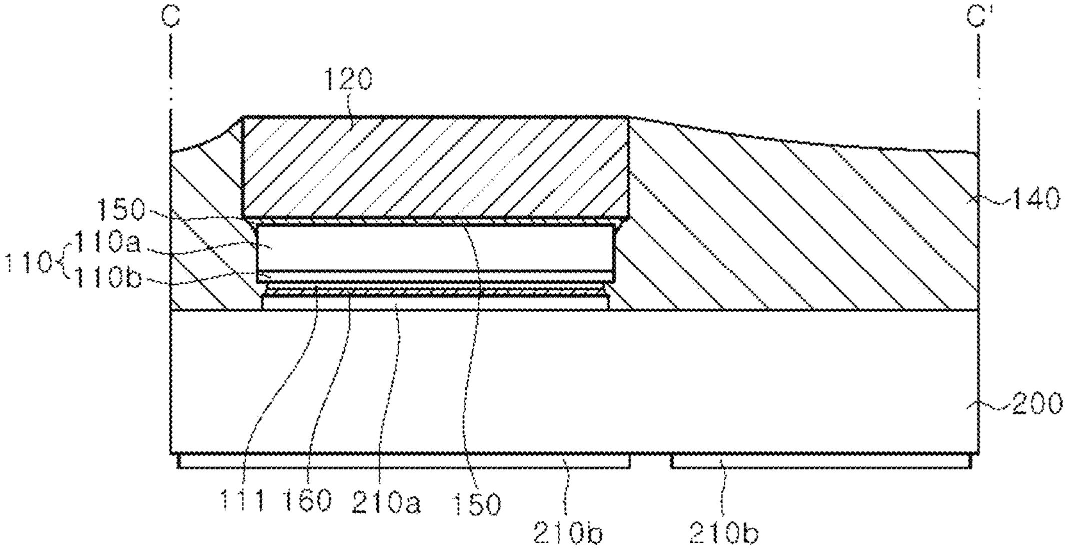
FIG. 1*d* is a schematic cross-sectional view taken along line B-B' of FIG. 1*a*.
Figure 1E:
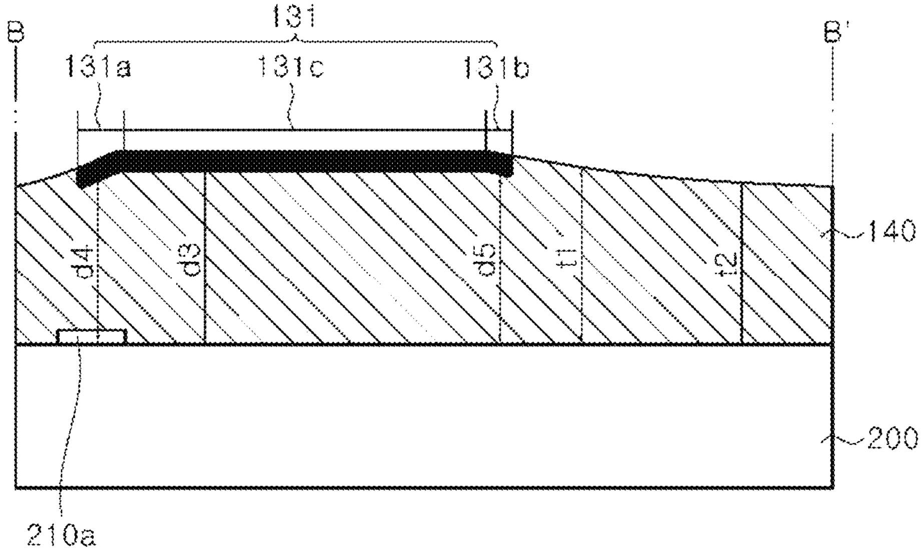
FIG. 1*e* is a schematic cross-sectional view taken along line C-C' of FIG. 1*a*.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

FIGS. 1*a* through 1*e* are a perspective view, a plan view, and a cross-sectional view illustrating a light emitting apparatus according to an exemplary embodiment of the present disclosure, respectively.

Referring to FIGS. 1*a* through 1*e*, a light emitting apparatus 10 may include a substrate 200 and two or more light emitting diode chips 110 disposed on the substrate 200. The light emitting apparatus 10 may include light emitting devices 100 each including the light emitting diode chip 110 and a light transmission layer 120 disposed on an upper surface of the light emitting diode chip 110, a sidewall portion 140 including an inner wall portion 141 disposed between the light emitting devices 100 and an outer wall portion 143 surrounding the light emitting devices 100, a first groove 131 disposed on the inner wall portion 141, and a second groove 133 disposed on the outer wall portion 143.

(Substrate)

The substrate 200 may be an insulating or conductive substrate. The substrate 200 may include a ceramic material having favorable thermal conductivity, such as AlN.

In addition, the substrate 200 may include circuit patterns 210 on an upper surface and/or a lower surface. An insulation layer may be included to insulate the circuit patterns 210 from each other. The insulation layer may be formed of an insulating material such as epoxy resin or Prepreg.

An upper circuit pattern 210*a* and a lower circuit pattern 210*b* of the substrate 200 may be connected through vias 210*c* passing through the substrate 200. The via 210*c* may be formed by forming a through hole in the substrate 200, and then filling it with a conductive material.

The via 210*c* may have a structure having a constant width from the upper surface to the lower surface of the substrate 200, but the inventive concepts are not limited thereto. For example, the via 210*c* may have a structure in which the width decreases from the upper and lower surfaces of the substrate 200 toward the inside of the substrate. Alternatively, two or more substrates 200 including the circuit patterns 210 may be included, and the vias 210*c* passing through the insulation layer may be alternatively arranged.

The circuit patterns 210 may be electrically connected to the plurality of light emitting diode chips 110 disposed on the substrate 200, and electrically connected to an external power source through a portion exposed under the substrate 200 to supply power to the plurality of light emitting diode chips 110.

Each of the plurality of light emitting diode chips 110 may be electrically connected to additional electrodes by the circuit pattern 210. By separately connecting power supplied to the electrodes, the plurality of light emitting diode chips 110 may be individually driven. However, the inventive concepts are not limited thereto, and the electrodes may be electrically interconnected with each other. In addition, the light emitting apparatus 10 may further include an additional control portion, and the driving of the plurality of light emitting diode chips 110 may be controlled by the control portion.

In addition, in the present disclosure, the upper and lower circuit patterns may be connected through a connection pattern (not shown) formed along a side surface of the substrate 200 instead of the via 210*c*.

(Light Emitting Diode Chip)

Like the embodiment of the present disclosure, the plurality of light emitting diode chips 110 may be bonded on the substrate 200.

Electrodes 111 of the plurality of light emitting diode chips 110 may be respectively connected to the circuit pattern 210 formed on the substrate 200 by eutectic bonding, without being limited thereto, or may be connected such as solder bonding, epoxy bonding, or the like. To bond the plurality of light emitting diode chips 110 to the substrate 200, a conductive material 160 for mechanically and electrically bonding to the upper circuit pattern 210*a* of the substrate 200 may be disposed.

Each of the plurality of light emitting diode chips 110 may include a semiconductor layer 110*b* including a growth substrate 110*a*, an n-type semiconductor layer, a p-type semiconductor layer, and an active layer interposed between the n-type semiconductor layer and the p-type semiconductor layer. In addition, each of the plurality of light emitting diode chips 110 may include the electrode 111 disposed on a lower surface of the semiconductor layer 110*b*. Accordingly, the light emitting diode chip 110 may emit light when power is supplied.

Meanwhile, in the present disclosure, the plurality of light emitting diode chips 110 is illustrated and described as being arranged in 1×2, but the inventive concepts are not limited thereto, and the plurality of light emitting diode chips 110 may be arranged in various matrices such as 1×18, 4×23, and 4×28 (n×m, n=1, 2, 3, 4, . . . , m=1, 2, 3, 4, . . . ).

(Light Transmission Layer)

The light transmission layer 120 may transmit light emitted from the light emitting diode chip 110, and may convert a wavelength of light emitted from the light emitting diode chip 110 to emit light of a specific color as needed. In addition, the light transmission layers 120 may emit light of different colors from each other.

The light transmission layer 120 may be a transparent resin such as silicone or epoxy, glass, ceramic, or the like, or may be a mixture of these materials and a wavelength conversion material converting the wavelength of light as needed. For example, the transparent resin may be transparent silicone. The wavelength conversion material may include at least one of a quantum dot phosphor, an inorganic or organic phosphor, and a yellow phosphor, a red phosphor, and a green phosphor may be used.

An example of the yellow phosphor may be YAG: Ce ($T_3Al_3O_{12}$:Ce-based phosphors or silicate-based phosphors, which is yttrium (Y) aluminum (Al) garnet doped with cerium (Ce) having a wavelength of 530 nm to 570 nm as a main wavelength.

An example of the red phosphor may a UOX ($Y_2O_3$:Eu)-based phosphor formed of a compound of yttrium oxide ($Y_2O_3$) and europium (Eu) having a wavelength of 600 nm to 700 nm as a main wavelength, a nitride phosphor, or a fluoride-based phosphor. In this case, it may be more preferable to include a fluoride compound KSF phosphor ($K_2SiF_6$), which is an $Mn^{4+}$ activator phosphor that is advantageous for high color reproduction. In addition, the red phosphor may be an Mn(IV)-activated luminescent materials based on an oxidohalide host lattice. The Mn(IV)-activated luminescent materials based on oxidohalide host lattices may have an emission maximum in a range between 610 nm and 640 nm, a high quantum yield, a high color rendering and stability and may be expressed by a general formula (I) or (II) as follows:

$$(A_{4-a}B_a)_{m/2+n/2}X_{2m}[MX_4O_2]_n \quad (I)$$

Herein, A is selected from a group consisting of H and D and mixtures thereof, in which D is deuterium; B is selected from a group consisting of Li, Na, K, Rb, Cs, $NH_4$, $ND_4$, $NR_4$ and mixtures of two or more thereof, wherein R is an alkyl or aryl radical; X is selected from a group consisting of F and Cl and mixtures thereof; M is selected from a group consisting of Cr, Mo, W, Re and mixtures of two or more thereof; $0 \leq a \leq 4$; $0 < m \leq 10$; and $1 \leq n \leq 10$;

$$A_3BF_2M_{1-x}T_xO_{2-2x}F_{4+2x} \quad (II)$$

Herein, A is selected from a group consisting of H and D and mixtures thereof, wherein D is deuterium; B is selected from a group consisting of Li, Na, K, Rb, Cs, Cu, Ag, Ti, $NH_4$, $ND_4$, $NR_4$ and mixtures of two or more thereof, wherein R is an alkyl or aryl radical; M is selected from a group consisting of Cr, Mo, W, Re and mixtures of two or more thereof; T is selected from a group consisting of Si, Ge, Sn, Ti, Pb, Ce, Zr, Hf and mixtures of two or more thereof; $0 \leq x \leq 1$.

An example of the green phosphor may be a LAP ($LaPO_4$: Ce, Tb)-based phosphor, which is a compound of phosphoric acid ($PO_4$), lanthanum (La), and terbium (Tb) with a wavelength of 500 nm to 590 nm as a main wavelength or a SiAlON-based phosphor.

An example of the blue phosphor may be a BAM ($BaMgAl_{10}O_{17}$:Eu)-based phosphor, which is a compound of barium (Ba), magnesium (Mg), aluminum oxide-based materials and europium (Eu) having a wavelength of 420 nm to 480 nm as a main wavelength.

The light transmission layer 120 may have an upper surface and a lower surface having a same width, and the upper and lower surfaces may be perpendicular to a side surface of the light transmission layer 120. A width of the light transmission layer 120 may be greater than that of the light emitting diode chip 110, and may be disposed to cover the upper surface of the light emitting diode chip 110. Accordingly, an area where light is emitted from the light transmission layer 120 may be formed to be relatively wider than that of the light emitting diode chip 110. The light transmission layer 120 may have a quadrangular shape, without being limited thereto.

Figure 2:
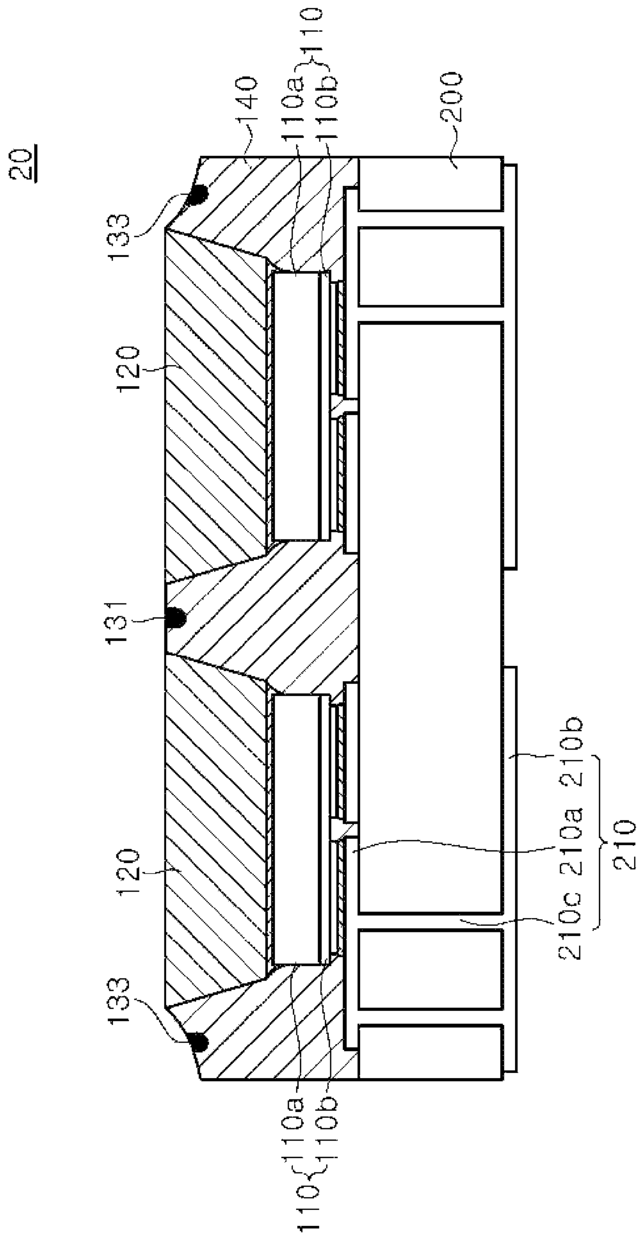
FIG. 2 is a schematic cross-sectional view illustrating a light emitting apparatus according to another embodiment of the present disclosure.

In another embodiment of the present disclosure, referring to FIG. 2, the width of the upper surface of the light transmission layer 120 may be greater than that of the lower surface, and the side surface of the light transmission layer 120 may form a reversed inclination from the upper surface to the lower surface. The structure may reduce absorption of light extracted from the light emitting diode chip 110, and may improve extraction efficiency of light extracted to the side.

Figure 3:
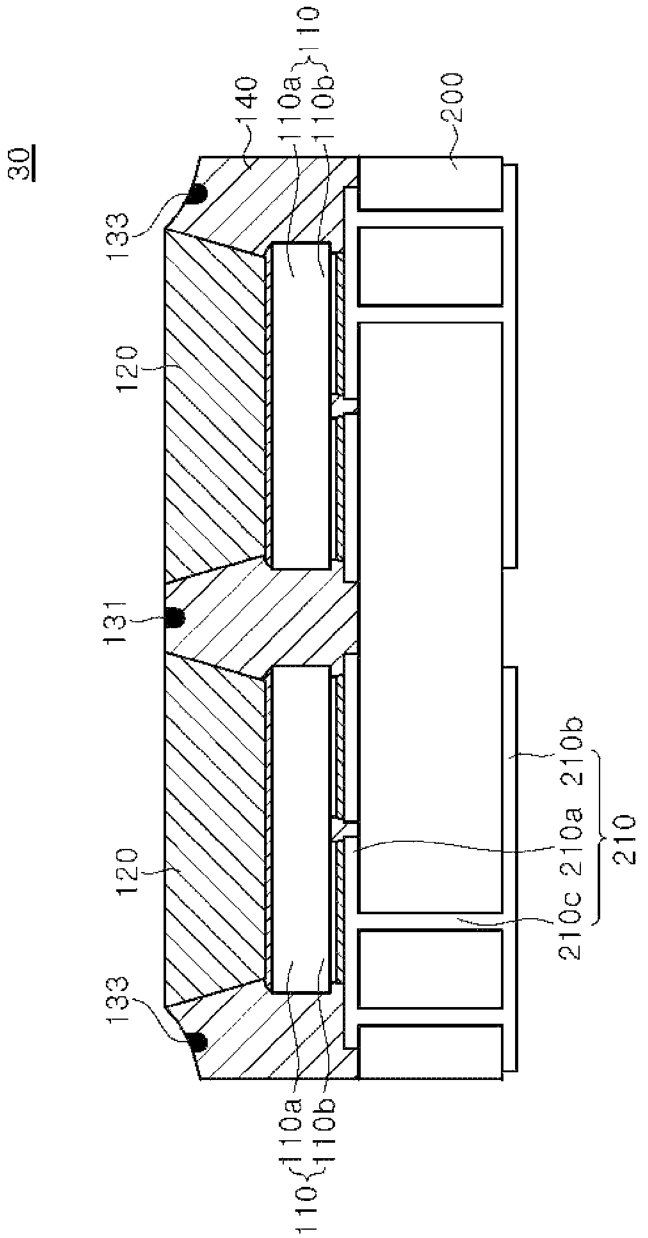
FIG. 3 is a schematic cross-sectional view illustrating a light emitting apparatus according to another embodiment of the present disclosure.

In another embodiment of the present disclosure, referring to FIG. 3, the width of the upper surface of the light transmission layer 120 may be greater than that of the lower surface, and the side surface of the light transmission layer 120 may form a reversed inclination from the upper surface to the lower surface. In addition, the lower surface of the light transmission layer 120 may be smaller than the width of the light emitting diode chip 110. Specifically, the width of the light emitting diode chip 110 may be formed to be smaller than the width of the upper surface of the light transmission layer 120, and larger than the width of the lower surface of the light transmission layer 120.

As the light transmission layer 120 becomes wider than the light emitting diode chip 110, a region where light is absorbed by the light transmission layer 120 increases, and thus, a luminance of extracted light may be decreased. Therefore, it is preferable that the light transmission layer 120 has the width similar to that of the light emitting diode chip 110.

A thickness of the light transmission layer 120 may be larger than that of the light emitting diode chip 110, without being limited thereto, and may be smaller than the thickness of the light emitting diode chip 110. For example, the light transmission layer 120 may have a thickness of 50 um to 300 um. Since light extracted from the light emitting diode chip 110 may be absorbed by the light transmission layer 120, it may be disposed with an appropriate thickness as needed.

The light transmission layer 120 may be PIG (Phosphor in Glass) in which a phosphor is mixed with glass. In an embodiment of the present disclosure, the light transmission layer 120 may be the PIG, and the PIG is effective in preventing external materials such as moisture and dust from infiltrating into the light emitting apparatus 10.

However, the inventive concepts are not limited thereto, and the light transmission layer 120 may be disposed by mixing a phosphor with ceramic such as polymer resin or glass. For example, in a case that the light transmission layer 120 is formed of a resin such as an epoxy resin or an acrylic resin, the light transmission layer 120 may be formed by coating and curing a resin containing a phosphor on the light emitting diode chip 110.

The phosphor may be formed of particles of various sizes. Some of the phosphor particles mixed in the light transmission layer 120 may have a diameter of 20 um or more, and some may have a diameter of 7 um or less. In addition, a phosphor emitting a same color range may include particles having a diameter of 20 um or more and particles having a diameter of 7 um or less, and may have various particle sizes in between.

In addition, the light transmission layer 120 may further include a diffuser. The diffuser should have a melting point not to melt when the wavelength conversion material is sintered, and for example, it may be $SiO_2$, $TiO_2$ and $Al_2O_3$, or the like.

A light-transmitting adhesive layer 150 may be disposed between the light transmission layer 120 and the light emitting diode chip 110. The light-transmitting adhesive layer 150 may have light-transmitting characteristics, and an organic adhesive such as silicone resin or epoxy resin or an inorganic adhesive such as low-melting glass may be used.

In addition, the light-transmitting adhesive layer 150 may cover at least a portion of a side surface of the growth substrate of the light emitting diode chip 110. The light-transmitting adhesive layer 150 may use a bonding method such as a direct bonding method, for example, compression bonding, sintering, hydroxyl group bonding, surface activation bonding, atomic diffusion bonding, or the like.

(Sidewall Portion)

The sidewall portion 140 may be formed to surround the light emitting device 100 including the light emitting diode chip 110 and the light transmission layer 120. In addition, the sidewall portion 140 may include the inner wall portion 141 disposed between the light emitting devices 100 and the outer wall portion 143 surrounding outer surfaces of the light emitting devices 100.

An upper surface of the inner wall portion 141 may be formed at a same level as that of the upper surface of the light transmission layer 120. The upper surface of the inner wall portion 141 may be flat, without being limited thereto, and may be concave or convex.

The outer wall portion 143 may be formed to have an inner wall thickness t1 thicker than an outer wall thickness t2. A difference between the thickness t1 of the inner wall and the thickness t2 of the outer wall may be 100 um or less, specifically, 60 um or less. The inner wall may be formed at substantially a same height as that of an upper surface contacting the side surface of the light transmission layer 120. The outer wall is a region where the outer wall portion 143 is adjacent to the side surface of the substrate 200, and may have an inclined surface in which the thickness of the outer wall portion 143 gradually decreases from the inner wall to the outer wall.

A side surface of the sidewall portion 140 may be formed on a co-planar as the side surface of the substrate 200 disposed thereunder, the inventive concepts are not limited thereto. For example, the side surface of the sidewall portion 140 may be formed more inward than the side surface of the substrate 200, or the side surface of the sidewall portion 140 may be formed in an oblique shape or the like from an edge of the substrate 200.

The sidewall portion 140 may be formed of a material having transparency and non-conductivity, and in this case, it is preferable to further include elasticity. For example, the sidewall portion 140 may be formed of epoxy resin, silicone resin, or acrylic resin. The sidewall portion 140 may be formed by including one or more of the resins and a reflective material. The reflective material may include $TiO_2$, $SiO_2$, ZrO2, $F_6K_2Ti$, $Al_2O_3$, AlN, BN, and the like.

(Groove)

Referring back to FIGS. 1*b* through 1*e*, the first groove 131 may be disposed on the sidewall portion 140. Preferably, at least a portion 131*c* of the first groove 131 may be disposed along the side surfaces of the plurality of light transmission layers 120 facing each other from a center of the upper surface of the inner wall portion 141. In addition, the second groove 133 may be disposed in the outer wall portion 143 of the sidewall portion of the present disclosure. In this case, respective distances from the side surfaces of the plurality of light transmission layers 120 to the first and second grooves 131 and 133 may be formed substantially same.

The first groove 131 may be disposed on the upper surface of the inner wall portion 141 formed at the same level as that of the upper surface of the light transmission layer 120, and the second groove 133 may be disposed on a surface inclined in an outer direction of the substrate 200 from a portion where the outer wall portion 143 is in contact with the upper surface of the light transmission layer 120. Accordingly, a shortest distance d1 from the substrate 200 to the first groove 131 may be greater than a shortest distance d2 to the second groove 133.

The first groove 131 and the second groove 133 may include extension portions extending more lengthily than the width of the light transmission layer 120. For example, the first groove 131 may have a first groove extension 131*a* extending from the side surface of the light transmission layer 120 opposite to a first side surface 140*a* and a second groove extension 131*b* extending from the side surface of the light transmission layer 120 opposite to a second side surface 140*ab*. A shortest distance from the first side surface 140*a* to an end portion of the first groove extension 131*a* may be smaller than a shortest distance from the second side surface 140*b* to an end portion of the second groove extension 131*b*. A distance from the first side surface 140*a* to the plurality of light transmission layers 120 may be smaller than a distance from the second side surface 140*b* to the plurality of light transmission layers 120, so that a light spreading phenomenon toward the first side surface 140*a* may occur. Therefore, by forming a length of the first groove extension 131*a* to be greater than a length of the second groove extension 131*b*, it is possible to alleviate the light spreading phenomenon to the first side surface portion 140*a*.

The first and second groove extensions 131*a* and 131*b* may also be formed in the second groove disposed on the inclined surface of the outer wall portion 143. The outer wall portion 143 has a shape in which the thickness t2 of the outer wall is smaller than the thickness t1 of the inner wall from the substrate 200. That is, the upper surface of the outer wall portion 143 may have an inclined surface, and the first and second groove extensions 131*a* and 131*b* may be disposed on the inclined surface. Accordingly, a distance d4 from the substrate 200 to the first groove extension 131*a* and a distance d5 to the second groove extension 131*b* may be formed smaller than a distance d3 from the substrate 200 to the groove 131*c* disposed between the light transmission layers 120.

A width w1 of the groove 131 may be smaller than a first width w2 and a second width w3 of the inner wall portion 141, and the first width w2 and the second width w3 may be substantially similar. The width w1 of the groove 131 may be 5 um to 70 um. Preferably, it may be 5 um to 50 um, and more preferably 5 um to 30 um. In addition, the first width w2 and the second width w3 may be 10 um to 110 um. Preferably, it may be 10 um to 90 um, and more preferably 10 um to 70 um.

Figure 4A:
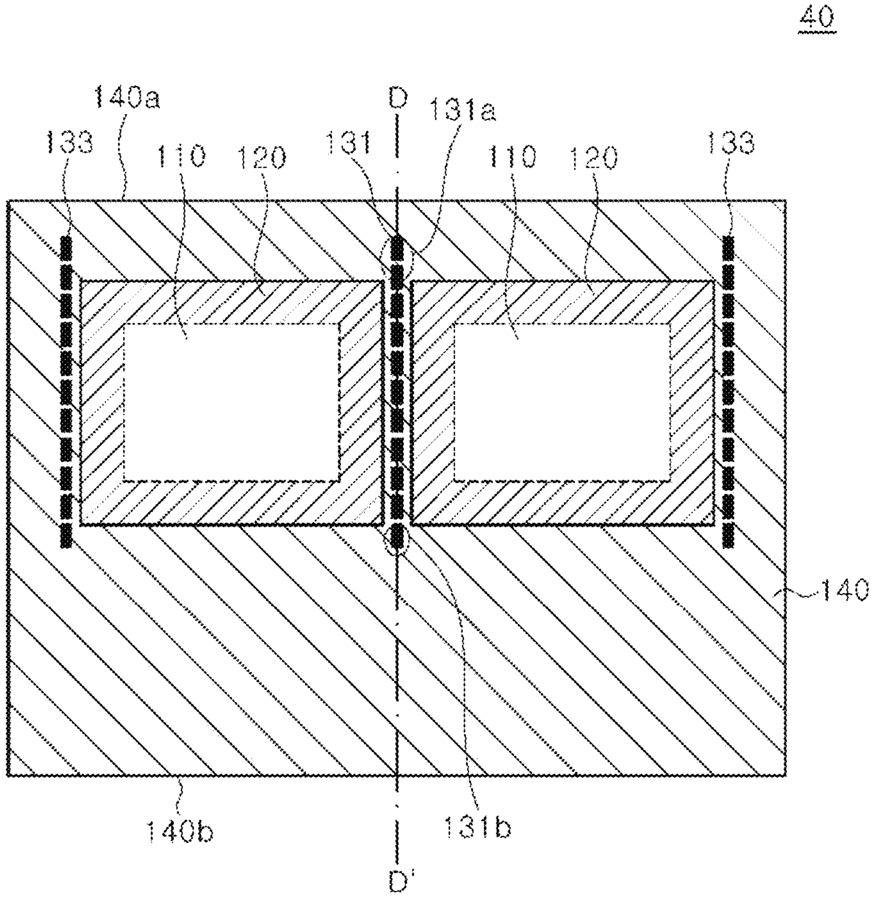
FIG. 4*a* is a schematic plan view illustrating a light emitting apparatus according to another embodiment of the present disclosure.
Figure 4B:
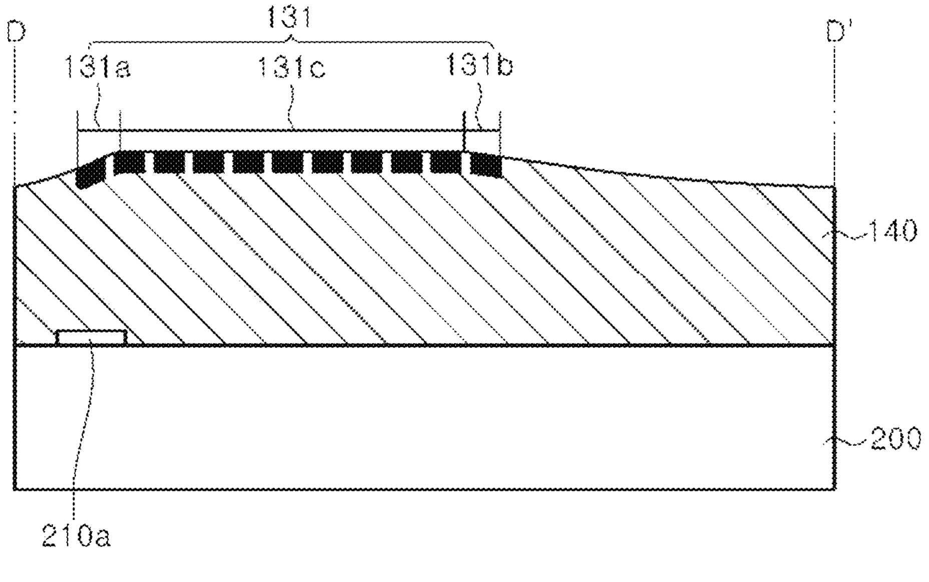
FIG. 4*b* is a schematic cross-sectional view taken along line D-D' of FIG. 4*a*.

The grooves 131 and 133 may be formed in a linear shape along the side surface of the light transmission layer 120, without being limited thereto, and may be formed in other shapes. For example, referring to FIGS. 4*a* and 4*b*, the grooves 131 and 133 may be disposed at intervals as indicated by dotted lines. The intervals between the dotted lines may be narrower or wider than those of the present embodiment. The dotted line may reduce light lost by the grooves 131 and 133, thereby improving light extraction efficiency.

Depths of the grooves 131 and 133 may be formed not to exceed ½ in a depth direction from the upper surface to the lower surface of the light transmission layer 120, without being limited thereto.

The grooves 131 and 133 may be formed by removing at least a portion of the sidewall portion 140 with irradiation with a laser, without being limited thereto, and a groove may be formed in the sidewall portion 140 using the laser and a blade, and a light-blocking material may be filled in an empty region.

Figure 5:
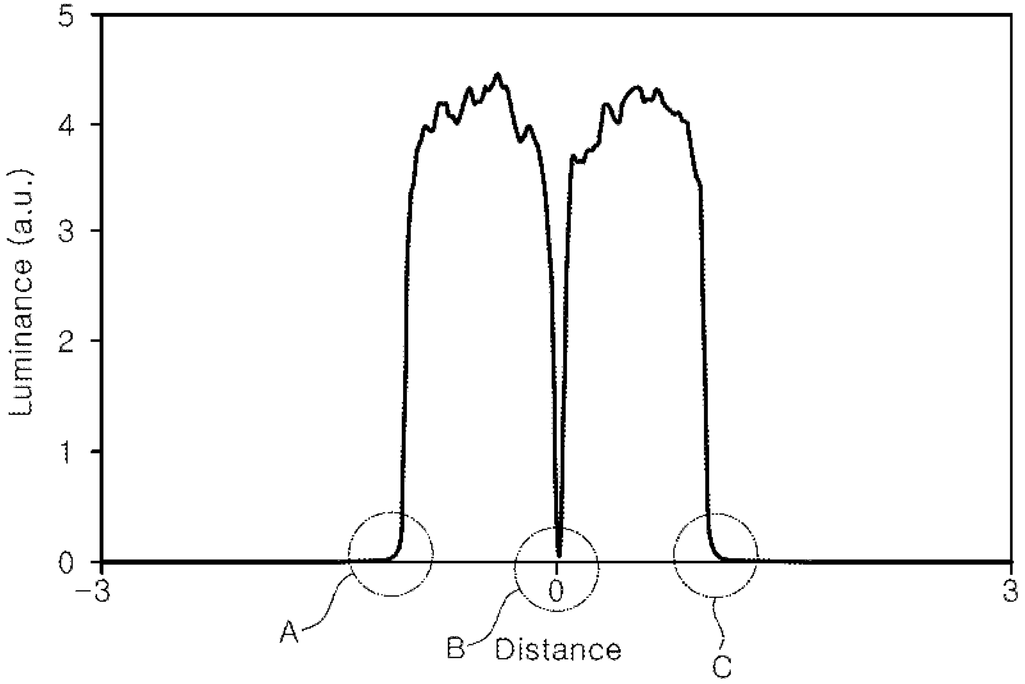
FIG. 5 is a graph illustrating a luminance of a light emitting apparatus according to an embodiment of the present disclosure.

Referring to FIG. 5, it can be confirmed that light is blocked between the light transmission layer 120 and the second groove 133 in a region A. In addition, it can be confirmed that no light is emitted from the grooves 131 disposed between the plurality of light transmission layers 120 in a region B. In addition, it can be confirmed that light is blocked between the light transmission layer 120 and the groove 133 in a region C. As such, the light emitting apparatus according to the embodiment of the present disclosure may prevent light from being emitted through the sidewall portion 140 by the grooves 131 and 133. Therefore, the light emitting apparatus of the present disclosure may prevent the light spreading phenomenon from occurring around edges of the plurality of light emitting diode chips 110.

Figure 6A:
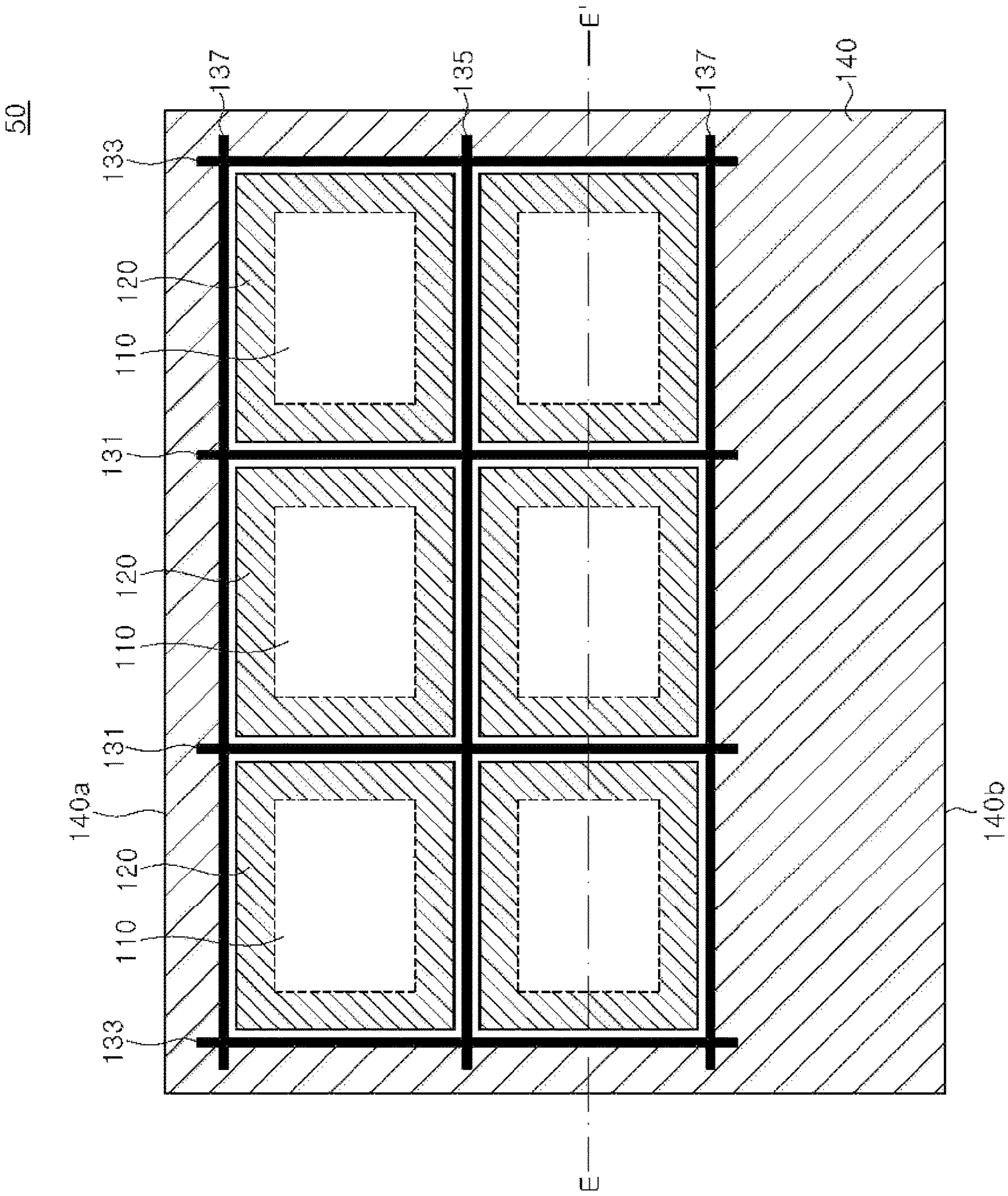
FIG. 6*a* is a schematic plan view illustrating a light emitting apparatus according to another embodiment of the present disclosure.
Figure 6B:
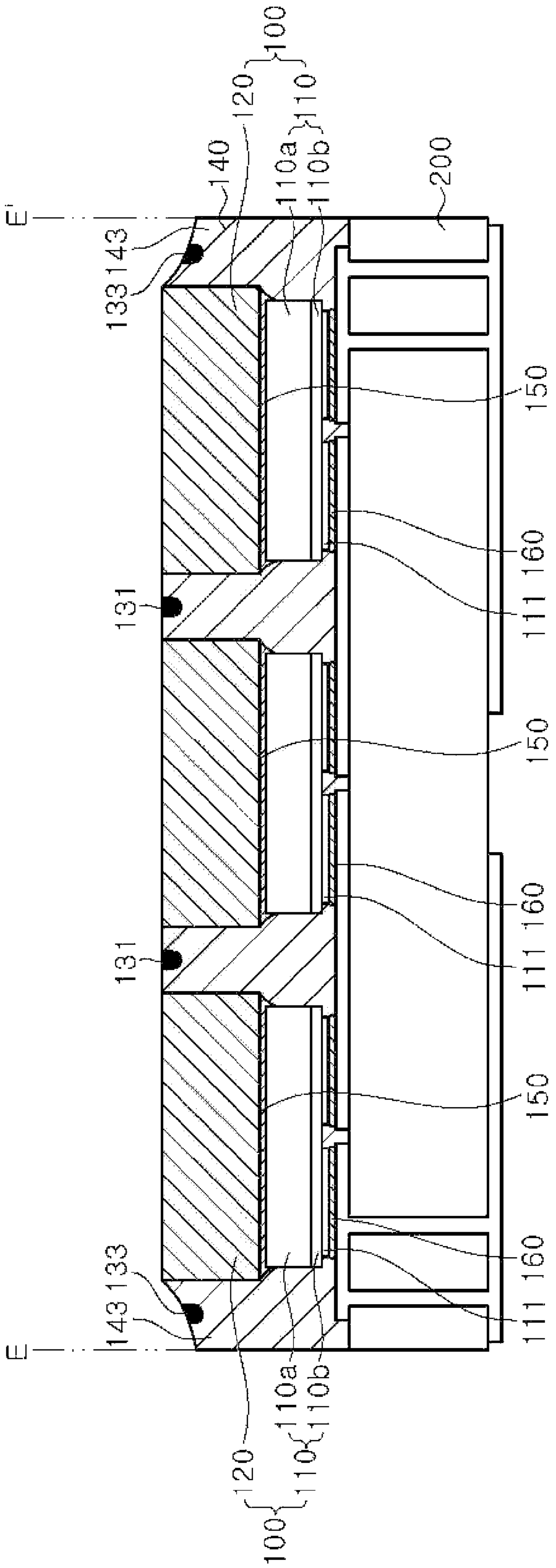
FIG. 6*b* is a schematic cross-sectional view taken along line E-E' of FIG. 6*a*.

FIGS. 6*a* and 6*b* are a plan and a cross-sectional views of a light emitting apparatus according to another embodiment of the present disclosure, respectively.

Referring to FIGS. 6*a* and 6*b*, a light emitting apparatus 50 may include a substrate 200, a plurality of light emitting diode chips 110 disposed on the substrate 200, and a plurality of light transmission layers 120 disposed on upper surfaces of the plurality of light emitting diode chips 110, and a first groove 131, a second groove 133, a third groove 135, and a fourth groove 137 disposed to surround side surfaces of the plurality of light transmission layers 120.

The first groove 131 and the third groove 135 may be disposed on an inner wall portion 141 of the plurality of sidewall portions 140, and the second groove 133 and the fourth groove 137 may be disposed on an outer wall portion 143 of the plurality of sidewall portions 140.

The first groove 131 and the second groove 133 may be disposed perpendicular to the third groove 135 and the fourth groove 137. The first groove 131 and the second groove 133 may have extension portions passing through the fourth groove 137. In addition, the third groove 135 and the fourth groove 137 may have extension portions passing through the second groove 133. The extension portions may be disposed on the outer wall portion 143.

In addition, the first groove 131 and the third groove 135 may have an intersecting region in the inner wall portion 141. Specifically, the first groove 131 and the third groove 135 may vertically intersect in a region where at least four edges of the plurality of light transmission layers are adjacent.

Respective distances from the side surfaces of the plurality of light transmission layers 120 to the first, second, third, and fourth grooves 131, 133, 135, and 137 may be formed substantially same.

Figure 7A:
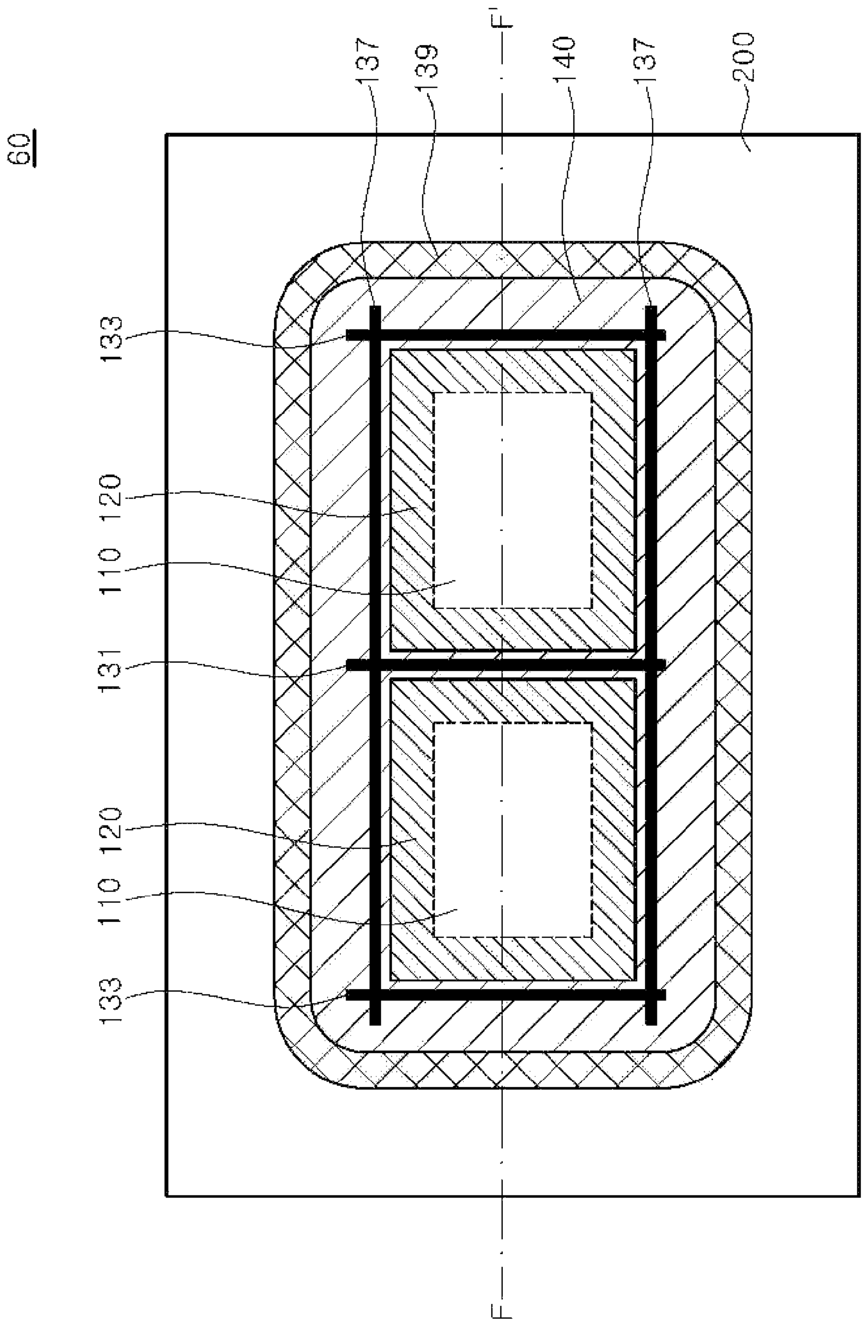
FIG. 7*a* is a schematic plan view illustrating a light emitting apparatus according to another embodiment of the present disclosure.
Figure 7B:
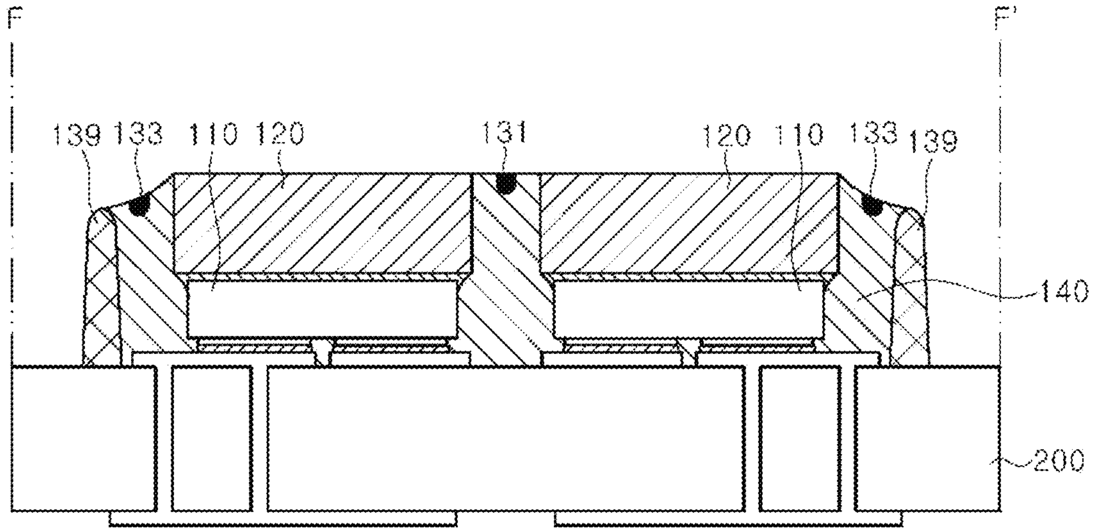
FIG. 7*b* is a schematic cross-sectional view taken along line F-F' of FIG. 7*a*.

FIGS. 7*a* and 7*b* are a plan view and a cross-sectional view of a light emitting apparatus according to another embodiment of the present disclosure, respectively.

Referring to FIGS. 7*a* and 7*b*, a light emitting apparatus 60 may include a substrate 200, a plurality of light emitting diode chips 110 disposed on the substrate 200, and a light emitting device 100 including a plurality of light transmission layers 120 disposed on upper surfaces of the plurality of light emitting diode chips 110, a sidewall portion 140 disposed to surround side surfaces of the plurality of light transmission layers 120, and grooves 131 and 133 and a dam 139 disposed to surround the side surfaces of light transmission layers 120.

The dam 139 is formed lower than a height of the light transmission layer 120, without being limited thereto, and may be disposed higher than the height of the light transmission layer 120. The dam 139 may surround the light emitting diode chip 110 and at least a portion of the light transmission layer 120 and may be formed in a rectangular ring shape. In addition, the dam 139 may be disposed more inward than a side surface of the substrate 200.

The sidewall portion 140 may be disposed between the dam 139 and the light emitting device 100. The dam 139 may be used as a frame for blocking uncured liquid resin material when forming the sidewall portion 140, and may be formed in close contact with the sidewall portion 140. The sidewall portion 140 may have an inclined surface that becomes thinner from an upper surface of the light transmission layer 120 toward an upper surface of the dam 139.

The dam 139 may be formed on an upper surface of the substrate 200 with a resin containing a reflective material. For example, the dam 139 may be formed of epoxy resin, silicone resin, and acrylic resin that have been exemplified in the sidewall portion 140. In addition, a white resin containing a light reflective material or a black resin containing a light absorbing material such as a black pigment may be used.

Figure 8:
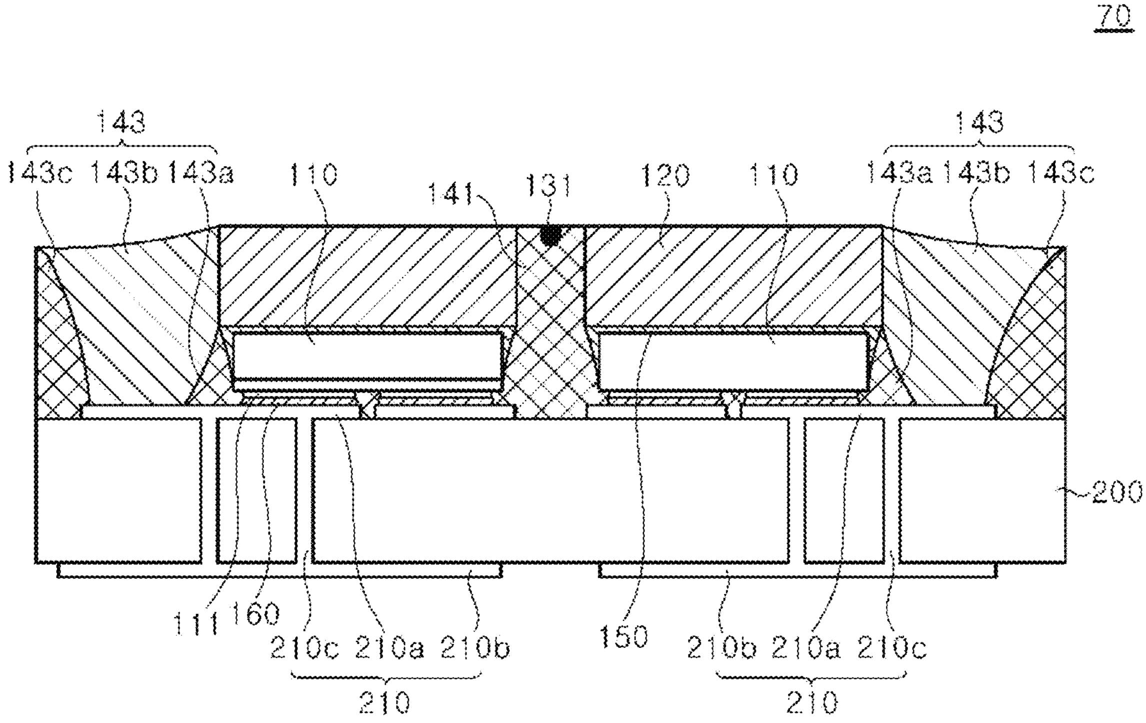
FIG. 8 is a schematic cross-sectional view illustrating a light emitting apparatus according to another embodiment of the present disclosure.

FIG. 8 is a schematic cross-sectional view illustrating a light emitting apparatus 70 according to another embodiment of the present disclosure.

Referring to FIG. 8, the light emitting apparatus 70 according to the present embodiment is generally similar to the light emitting apparatus 10 described with reference to FIGS. 1*a* through 1*e*, except that a structure of the sidewall portion is different.

The first groove 131 may be disposed on the upper surface of the inner wall portion 141. As described above, the first groove 131 may be filled with a light blocking material. The first groove 131 is disposed between the light transmission layers 120 to block light emitted from the light transmission layer 120 from being emitted through the inner wall portion 141, and thus, the light spreading phenomenon of the light emitting apparatus may be prevented.

The outer wall portion 143 may include a plurality of outer wall portions 143*a*, 143*b*, and 143*c*. A first outer wall portion 143*a* surrounds outer surfaces of the light emitting diode chips 110. An upper end portion of the first outer wall portion 143*a* may contact the light transmission layer 120. As shown in the drawings, the upper end portion of the first outer wall portion 143*a* may be disposed higher than the upper surface of the light emitting diode chip 110, and may be disposed under ½ of the thickness of the light transmission layer 120. The upper end portion of the first outer wall portion 143*a* may be disposed at a same height as that of an upper surface of the light-transmitting adhesive layer 150, that is, the lower surface of the light transmission layer 120.

A second outer wall portion 143*b* surrounds the first outer wall portion 143*a*, and further surrounds outer surfaces of the light transmission layers 120. The second outer wall portion 143*b* may contact the side surfaces of the light transmission layers 120. The second outer wall portion 143*b* may have a greater width than those of the first and third outer wall portions 143*a* and 143*c*. A bottom surface of the second outer wall portion 143*b* may be in contact with the substrate 200, an inner surface of the second outer wall portion 143*b* may be in contact with the first outer wall portion 143*a* and the transmission layer 120, and an outer surface of the second outer wall portion 143*b* may be in contact with a third outer wall portion 143*c*. An upper surface of the second outer wall portion 143*b* extends from an upper surface of the third outer wall portion 143*c* and the upper surface of the light transmission layer 120, and the upper surface of the second outer wall portion 143*b* may have a curved shape in at least a partial region. The upper surface and the bottom surface of the second outer wall portion 143*b* may have different widths from each other. In addition, the second outer wall portion 143*b* may have a greater width in a region contacting a bottom surface of the transmission layer than that of the bottom surface thereof, and the width in the region contacting the bottom surface of the transmission layer may be smaller than that of the upper surface thereof. A width of the bottom surface of the second outer wall portion 143*b* may be less than ½ of the width of the upper surface. The third outer wall portion 143*c* surrounds the second outer wall portion 143*b*. The third outer wall portion 143*c* forms an outer sidewall of the light emitting apparatus 70. The third outer wall portion 143*c* may have a shape in which a width thereof increases as it becomes close to the substrate 200. An inner surface of the third outer wall portion 143*c* may be formed as a curved surface, and an outer surface may be formed as a plane parallel to the side surface of the substrate 200. The outer surface of the third outer wall portion 143*c* may be in flush with the side surface of the substrate 200. In an embodiment, a bottom surface of the third outer wall portion 143*c* may be in contact with the substrate 200, and a lower end portion of the inner surface may have an inclination angle of 70 degrees or more and less than 100 degrees with respect to the substrate 200, specifically, it may have the inclination angle of 80 degrees or more and less than 90 degrees.

The first to third outer wall portions 143*a*, 143*b*, and 143*c* may be formed of silicone resin, epoxy resin, or acrylic resin, and may be formed by including one or more of the resins and a reflective material. The reflective material may include $TiO_2$, $SiO_2$, ZrO2, $F_6K_2Ti$, $Al_2O_3$, AlN, BN, and the like.

Meanwhile, the second outer wall portion 143*b* may be formed of a material different from those of the first and third outer wall portions 143*a* and 143*c*. For example, the first outer wall portion 143*a* and the third outer wall portion 143*c* may be formed of a same type of resin including a reflective material, and the second outer wall portion 143*b* may be formed of the same or different type of resin as those of the first and third outer wall portions 143*a* and 143*c*, but may include a material for preventing cracks, for example, a material containing calcium. In addition, the width of the second outer wall portion 143*b* may be controlled to reduce light loss. For example, a maximum width of the second outer wall portion 143*b* may be 1500 um or less, and specifically, the maximum width may be 300 um to 1000 um. When the maximum width of the second outer wall portion 143*b* is 600 um to 1000 um, cracks may be effectively prevented and light loss may be reduced.

The inner wall portion 141 may be formed of a same material as that of the first outer wall portion 143*a*, without being limited thereto, and may be formed of a same material as that of the second outer wall portion 143*b*.

The light-transmitting adhesive layer 150 may include a region disposed between the light emitting diode chip 110 and the light transmission layer 120 and a region surrounding a side surface of the light emitting diode chip 110. The region of the light-transmitting adhesive layer 150 surrounding the side surface of the light emitting diode chip 110 may contact the inner wall portion 141 and the first outer wall portion 143*a*. A thickness of the light-transmitting adhesive layer 150 disposed on the upper surface of the light emitting diode chip 110 may be different from that of the region surrounding the side surface of the light emitting diode chip 110. For example, the light-transmitting adhesive layer 150 disposed on the upper surface of the light emitting diode chip 110 may have a thickness of 2 um or more and 10 um or less. Meanwhile, the light-transmitting adhesive layer 150 formed on the side surface of the light emitting diode chip 110 may have a smaller width as it becomes close to the substrate 200. The light-transmitting adhesive layer 150 may cover portions of the side surfaces of the light emitting diode chip 110, or may cover entire side surfaces of the light emitting diode chip 110.

In this embodiment, the outer wall portion 143 may have different widths according to positions. As shown in FIG. 8, a right outer wall portion 143 may have a larger width than a left outer wall portion 143. In particular, the width of the third outer wall portion 143*c* may be different depending on positions. However, a difference in the width of the outer wall portion 143 depending on the positions is controlled not to affect a light profile, and may be, for example, 100 um or less, and further, 50 um or less.

According to this embodiment, since the outer wall portion 143 includes the plurality of outer wall portions 143*a*, 143*b*, and 143*c*, it is possible to prevent light spreading through the outer wall portion 143. Accordingly, the second groove formed on the outer wall portion 143 in the previous embodiments may be omitted.

Figure 9:
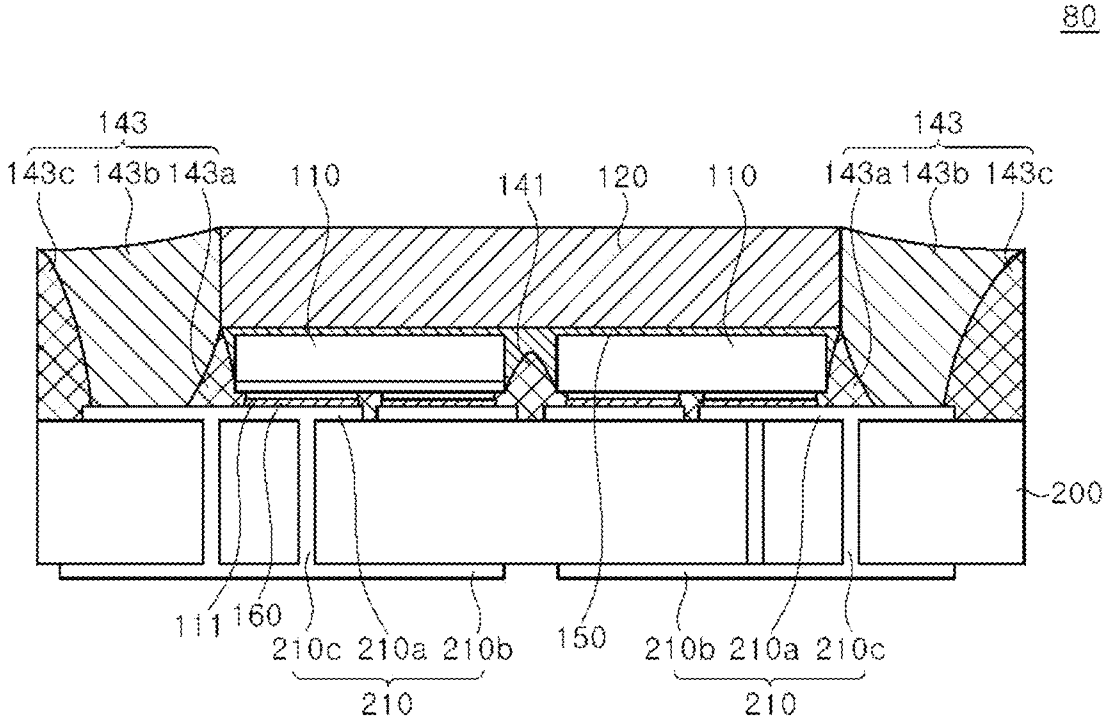
FIG. 9 is a schematic cross-sectional view illustrating a light emitting apparatus according to another embodiment of the present disclosure.

FIG. 9 is a schematic cross-sectional view illustrating a light emitting apparatus 80 according to another embodiment of the present disclosure.

Referring to FIG. 9, the light emitting apparatus 80 according to the present embodiment is substantially similar to the light emitting apparatus 70 described with reference to FIG. 8, except that a single light transmission layer 120 covers the plurality of light emitting diode chips 110.

That is, one light transmission layer 120 covers the plurality of light emitting diode chips 110 disposed on the substrate 200. Light emitted from the light emitting diode chips 110 is emitted to the outside through a same light transmission layer 120. Accordingly, the inner wall portion 141 is disposed between the light emitting diode chips 110 under the light transmission layer 120, and the first groove described above is omitted.

Meanwhile, as described with reference to FIG. 8, the outer wall portion 143 may prevent the light spreading phenomenon by including the plurality of outer wall portions 143*a*, 143*b*, and 143*c*, thereby preventing light interference between light emitting apparatuses.

Although some exemplary embodiments have been described herein, it should be understood that these exemplary embodiments are provided for illustration only and are not to be construed in any way as limiting the present disclosure. In addition, it should be understood that features or components of one exemplary embodiment can also be applied to other exemplary embodiments without departing from the spirit and scope of the present disclosure.

The invention claimed is:

1. A light emitting apparatus, comprising:

a substrate;

a plurality of light emitting diode chips disposed over the substrate;

a plurality of light transmission layers disposed on upper surfaces of the plurality of light emitting diode chips;

a sidewall portion surrounding the plurality of light emitting diode chips and the plurality of light transmission layers; and a first groove disposed on an upper surface of at least a portion of the sidewall portion disposed between the light transmission layers, wherein the first groove has a width narrower than a shortest width from a nearest light transmission layer to the first groove, and a depth smaller than a thickness of the nearest light transmission layer.

2. The light emitting apparatus of claim 1, wherein the substrate has pattern electrodes on an upper surface and a lower surface, and has a circuit pattern including vias electrically connecting the pattern electrodes on the upper surface and the lower surface.

3. The light emitting apparatus of claim 1, wherein the plurality of light transmission layers includes a wavelength conversion material.

4. The light emitting apparatus of claim 3, wherein widths of upper and lower surfaces of the plurality of light transmission layers are same.

5. The light emitting apparatus of claim 4, wherein the widths of the lower surfaces of the plurality of light transmission layers are greater than widths of the plurality of light emitting diode chips, respectively.

6. The light emitting apparatus of claim 3, wherein widths of upper surfaces of the plurality of light transmission layers are wider than those of the lower surfaces thereof.

7. The light emitting apparatus of claim 1, wherein the sidewall portion comprises:

an outer wall portion surrounding outer surfaces of the plurality of light emitting diode chips and the plurality of light transmission layers; and an inner wall portion formed between side surfaces of the plurality of light emitting diode chips and the plurality of light transmission layers facing each other.

8. The light emitting apparatus of claim 7, wherein the outer wall portion has an inclined surface in which a thickness from the substrate decreases as a distance from a surface adjacent to a side surface of the light transmission layer increases.

9. The light emitting apparatus of claim 1, further comprising:

a second groove formed on an upper surface of the sidewall portion surrounding outer surfaces of the plurality of light transmission layers, wherein the first groove and the second groove have a shape elongated along side surfaces of the plurality of light transmission layers.

10. The light emitting apparatus of claim 9, wherein a shortest distance from the substrate to the first groove is greater than a shortest distance from the substrate to the second groove.

11. The light emitting apparatus of claim 9, wherein the substrate includes a first side surface and a second side opposite to the first side surface, and a first groove extension extending to the first side surface and a second groove extension extending to the second side surface.

12. The light emitting apparatus of claim 11, wherein a length of the first groove extension is greater than a length of the second groove extension.

13. The light emitting apparatus of claim 11, wherein:

the sidewall portion includes an outer wall portion and an inner wall portion, and the first groove extension and the second groove extension are disposed on the outer wall portion.

14. The light emitting apparatus of claim 13, wherein a distance between the first side surface and an end portion of the first groove extension is smaller than a distance between the second side surface and an end portion of the second groove extension.

15. The light emitting apparatus of claim 9, further comprising:

a third groove and a fourth groove perpendicular to the first groove and the second groove, and disposed on the side surfaces of the plurality of light transmission layers.

16. The light emitting apparatus of claim 15, wherein respective distances from the side surfaces of the plurality of light transmission layers to the first, second, third, and fourth grooves are substantially same.

17. The light emitting apparatus of claim 15, wherein:

the first groove and the second groove have an extension portion passing through the fourth groove and disposed on an outer wall portion of the sidewall portion, and the third groove and the fourth groove have an extension portion passing through the second groove and disposed on the outer wall portion.

18. The light emitting apparatus of claim 17, wherein the first groove and the third groove vertically intersect in a region where at least four edges of the plurality of light transmission layers are adjacent.

19. A light emitting apparatus, comprising:

a substrate;

a plurality of light emitting diode chips disposed over the substrate;

a light transmission layer disposed on upper surfaces of the plurality of light emitting diode chips; and a sidewall portion surrounding the plurality of light emitting diode chips and the light transmission layer, wherein:

the sidewall portion includes a first outer wall portion surrounding outer surfaces of the plurality of light emitting diode chips, a second outer wall portion surrounding the first outer wall portion, and a third outer wall portion surrounding the second outer wall portion, and the second outer wall portion is in contact with a side surface of the light transmission layer.

20. The light emitting apparatus of claim 19, wherein the second outer wall portion includes an anti-crack material containing calcium.

* * * * *